United States Patent
Choi et al.

(10) Patent No.: US 7,883,965 B2
(45) Date of Patent: Feb. 8, 2011

(54) SEMICONDUCTOR DEVICE AND METHOD FOR FABRICATING THE SAME

(75) Inventors: Shin Gyu Choi, Seoul (KR); Seung Chul Oh, Icheon-si (KR)

(73) Assignee: Hynix Semiconductor Inc., Icheon-si (KR)

( * ) Notice: Subject to any disclaimer, the term of this patent is extended or adjusted under 35 U.S.C. 154(b) by 627 days.

(21) Appl. No.: 11/618,773

(22) Filed: Dec. 30, 2006

(65) Prior Publication Data

US 2008/0023753 A1 Jan. 31, 2008

(30) Foreign Application Priority Data

Jul. 31, 2006 (KR) .................. 10-2006-0072021
Dec. 19, 2006 (KR) .................. 10-2006-0130210

(51) Int. Cl.
*H01L 21/336* (2006.01)

(52) U.S. Cl. .............. 438/259; 438/268; 438/272; 438/270; 438/156; 257/E21.238; 257/E21.624

(58) Field of Classification Search ........... 257/288; 438/734, 268, 272, 270, 156, 259, E21.238, 438/E21.624

See application file for complete search history.

(56) References Cited

U.S. PATENT DOCUMENTS

| 5,949,101 A * | 9/1999 | Aritome .................. 257/315 |
| 6,972,232 B2 * | 12/2005 | Osanai .................. 438/270 |
| 2003/0032248 A1 * | 2/2003 | Yue et al. .................. 438/270 |
| 2006/0113590 A1 * | 6/2006 | Kim et al. .................. 257/330 |
| 2006/0138474 A1 | 6/2006 | Yu et al. |

FOREIGN PATENT DOCUMENTS

| JP | 04-206972 | 7/1992 |
| KR | 1020060058959 A | 6/2006 |
| KR | 1020060075240 A | 7/2006 |
| KR | 100855273 B1 | 8/2008 |

* cited by examiner

*Primary Examiner*—Ngan Ngo
*Assistant Examiner*—Benjamin Tzu-Hung Liu
(74) *Attorney, Agent, or Firm*—Townsend and Townsend and Crew LLP (57) ABSTRACT

A semiconductor device includes a device isolation structure, a recess channel structure, and a gate electrode. The device isolation structure is formed in a semiconductor substrate to define an active region. The recess channel structure is disposed in the semiconductor substrate under the active region. The gate electrode includes a holding layer disposed in a gate region to fill the recess channel structure. The holding layer prevents a seam and a shift of the seam occurring in the recess channel structure.

20 Claims, 11 Drawing Sheets

SEMICONDUCTOR DEVICE AND METHOD FOR FABRICATING THE SAME

CROSS-REFERENCES TO RELATED APPLICATIONS

The present application claims priority to Korean patent application numbers 10-2006-0072021 and 10-2006-0130210, respectively filed on Jul. 31, 2006 and on Dec. 19, 2006, which are incorporated by references in their entireties.

BACKGROUND OF THE INVENTION

The present invention relates to a memory device. More particularly, the present invention relates to a semiconductor device having an improved recess channel transistor and a method for fabricating the same.

As the design rules of the semiconductor device shrinks, it is difficult to control the Short Channel Effect ("SCE"). Accordingly, Multi-channel Field Effect Transistors ("McFET") such as a recessed channel transistor and a fin channel transistor have been proposed to increase the channel length of the cell transistor.

BRIEF SUMMARY OF THE INVENTION

Embodiments of the present invention are directed to semiconductor devices having an improved recess channel transistor. According to one embodiment of the present invention, the improved recess channel transistor has a recess channel structure and a gate electrode including a holding layer.

In another embodiment of the present invention, a method for fabricating a semiconductor device comprises: forming a recess channel structure in a semiconductor substrate having a device isolation structure defining an active region; forming a gate conductive layer including a holding layer over the substrate to fill the recess channel structure, the holding layer configured to prevent a seam and a shift of the seam occurring in the recess channel structure; and patterning the gate conductive layer to form a gate structure.

In another embodiment of the present invention, a semiconductor device comprises: a device isolation structure formed in a semiconductor substrate, the device isolation structure defining an active region; a recess channel structure disposed in the semiconductor substrate under the active region; and a gate electrode including a holding layer disposed in a gate region, the gate electrode filling the recess channel structure, wherein the holding layer prevents a seam and a shift of the seam occurring in the recess channel structure.

In another embodiment of the present invention, a semiconductor device comprises: a device isolation structure formed in a semiconductor substrate having a PMOS region and a NMOS region, the device isolation structure defining an active region; a bulb-type recess channel structure disposed in the semiconductor substrate under the active region; and a lower gate electrode disposed over the active region, the lower gate electrode including a stacked structure having a first lower gate conductive layer, a holding layer, and a second lower gate conductive layer to fill the bulb-type recess channel structure, wherein the first lower gate conductive layer is formed of a polysilicon layer doped with impurity ions, the holding layer prevents a seam and a shift of the seam occurring in the bulb-type recess channel structure, and the second lower gate conductive layer is formed of a polysilicon layer doped with impurity ions wherein the impurity ions in the PMOS region and the NMOS region are different.

DESCRIPTION OF SPECIFIC EMBODIMENTS

The present invention relates to a semiconductor device having an improved recess channel transistor and a method for fabricating the same. In one embodiment of the present invention, the improved recess channel transistor has a recess channel structure that increases the channel length and a gate electrode that includes a holding layer for preventing a seam occurring when the recess channel structure is filled and for minimizing a shift of the seam caused from the subsequent thermal treatment process. Accordingly, the operation characteristics of the device can be improved.

Figure 1:
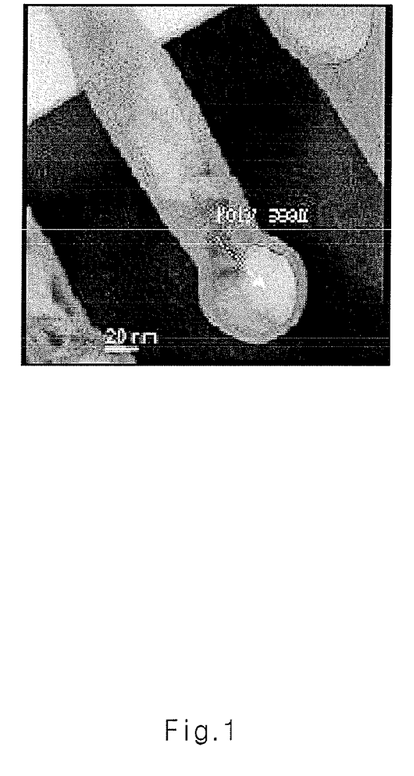
FIG. 1 is a simplified cross-sectional photograph of a semiconductor device.

FIG. 1 illustrates a simplified cross-sectional photograph of a semiconductor device. The semiconductor device includes a three-dimensional recess channel structure in order to increase the channel length of the device. It can be seen that the seam occurs in the three dimension recess channel structure. That is, when the three dimensional recess channel structure is filled with a gate conductive layer, the seam occurs in the lower part of the recess channel structure due to its topological characteristics such as high aspect ratio of the recess channel structure. The seam may be transformed during a subsequent thermal treatment process. The transformed seam may be moved to or near to a gate insulating film, which has an effect comparable to increasing the width of the gate insulating film.

Figure 2:
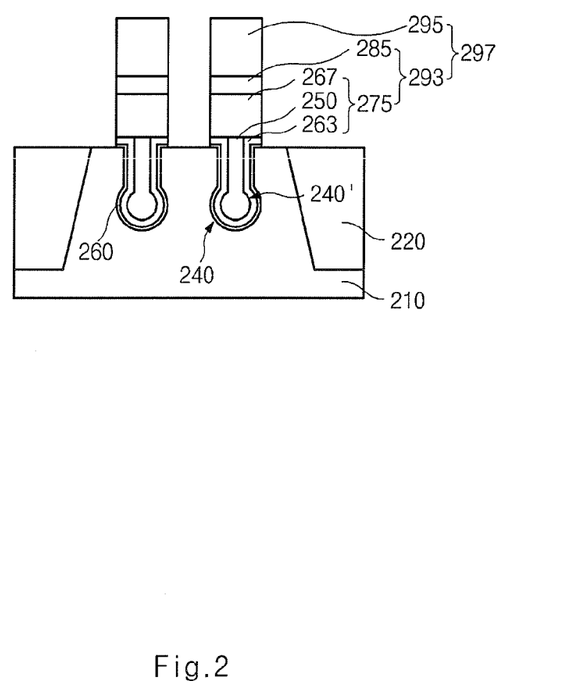
FIG. 2 is a simplified cross-sectional view of a semiconductor device according to an embodiment of the present invention.

FIG. 2 illustrates a cross-sectional view of a semiconductor device according to one embodiment of the present invention. The semiconductor device includes a device isolation structure 220, a three-dimensional recess channel structure 240, a gate insulating film 260, and a lower gate electrode 275. The device isolation structure 220 is formed in the semiconductor substrate 210 to define an active region. The three-dimensional recess channel structure 240 is disposed in the semiconductor substrate 210 under the active region. The gate insulating film 260 is disposed over the active region including the recess channel structure 240. The lower gate electrode 275 is disposed over the gate insulating film 260 to fill the three-dimensional recess channel structure 240.

In one embodiment of the present invention, the lower gate electrode 275 includes a stacked structure having a first lower gate conductive layer 263, a holding layer 250, and a second lower gate conductive layer 267. The first lower gate conductive layer 263 is formed conformal to the recess channel structure 240 and defines a recess 240' therein. The holding layer 250 is disposed between the first lower gate conductive layer 263 and the second lower gate conductive layer 267 to prevent the seam occurring in the filling process of the recess channel structure 240 and to minimize a shift of the seam during a subsequent thermal treatment process. The holding layer 250 fills the recess 240' defined by the first lower gate conductive layer 263 in the present implementation.

In one embodiment of the present invention, the first lower gate conductive layer 263 includes a polysilicon layer doped with impurity ions including phosphorous (P). The concentration of the P impurity ions ranges from about 1.0E20 ions/cm$^3$ to about 4.0E20 ions/cm$^3$. The holding layer 250 is selected from the group consisting of an insulating film, a metal film, a conductive layer, and combinations thereof. In one implementation, the holding layer 250 is formed of a Spin-on-Dielectric ("SOD") oxide film or a crystallized polysilicon layer. In addition, the second lower gate conductive layer 267 includes a polysilicon layer doped with impurity ions including boron (B) and phosphorous (P). For the P-type region, the concentration of the B impurity ions ranges from about 5.0E15 ions/cm$^3$ to about 5.0E16 ions/cm$^3$. For the N-type region, the concentration of the P impurity ions ranges from about 1.0E15 ions/cm$^3$ to about 7.0E15 ions/cm$^3$.

In another embodiment of the present invention, the semiconductor device further includes a gate structure 297 disposed over the three-dimensional recess channel structure 240. The gate structure 297 includes a stacked structure having a gate electrode 293 and a gate hard mask layer pattern 295. In addition, the gate electrode 293 includes a stacked structure having a lower gate electrode 275 and an upper gate electrode 285.

Figure 3:
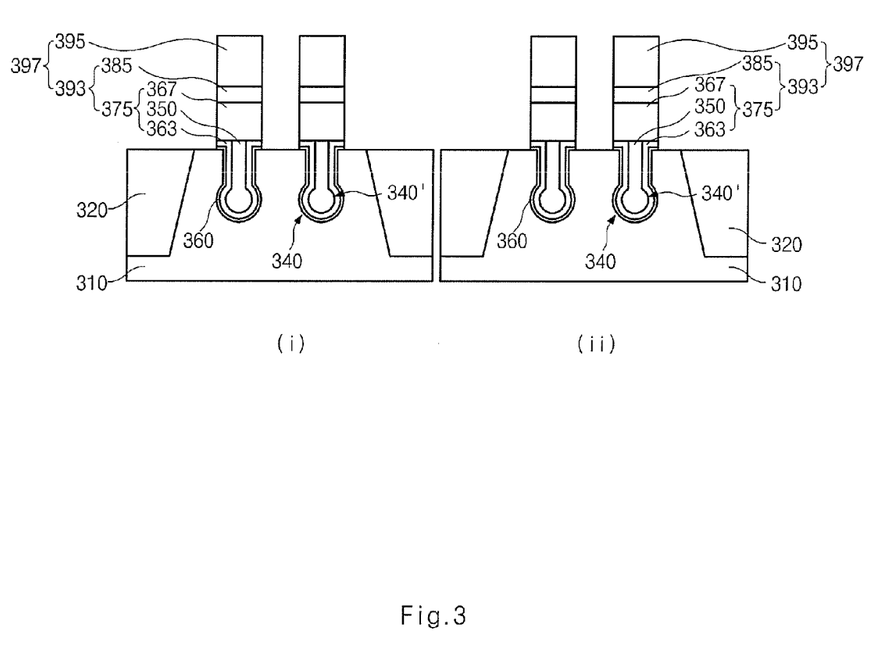
FIG. 3 is a simplified cross-sectional view of a semiconductor device according to another embodiment of the present invention.

FIG. 3 illustrates a cross-sectional view of a semiconductor device according to another embodiment of the present invention. FIG. 3(i) illustrates a cross-sectional view of a semiconductor device in a NMOS region. FIG. 3(ii) illustrates a cross-sectional view of a semiconductor device in a PMOS region. The semiconductor device includes a device isolation structure 320, a bulb-type recess channel structure 340, a gate insulating film 360, and a lower gate electrode 375. The device isolation structure 320 is formed in a semiconductor substrate 310 having the NMOS region and the PMOS region to define an active region. The bulb-type recess channel structure 340 is disposed in the semiconductor substrate 310 under the active region. The gate insulating film 360 is disposed over the semiconductor substrate 310 including the bulb-type recess channel structure 340. The lower gate electrode 375 is disposed over the gate insulating film 360 to fill the bulb-type recess channel structure 340.

The lower gate electrode 375 includes a stacked structure having a first lower gate conductive layer 363, a holding layer 350, and a second lower gate conductive layer 367. The first lower gate conductive layer 363 is formed conformal to the recess channel structure 340 and defines a recess 340' therein. The holding layer 350 is disposed between the first lower gate conductive layer 363 and the second lower gate conductive layer 367 to prevent a seam from being generated in the filling process of the recess channel structure 340 and to minimize a shift of the seam during a subsequent thermal treatment process. The holding layer 350 fills the recess 340' defined by the first lower gate conductive layer 363 in the present implementation.

In one embodiment of the present invention, the first lower gate conductive layer 363 includes a polysilicon layer doped with impurity ions including phosphorous (P). The concentration of the P impurity ions ranges from about 1.0E20 ions/cm$^3$ to about 4.0E20 ions/cm$^3$. The holding layer 350 is selected from the group consisting of an insulating film, a metal film, a conductive layer, and combinations thereof. In the present implementation, the holding layer 350 is formed of a SOD oxide film or a crystallized polysilicon layer.

In addition, the second lower gate conductive layer 367 includes a polysilicon layer doped with impurity ions. The impurity ions in the PMOS region include boron (B) with its concentration in the range of about 5.0E15 ions/cm$^3$ to about 5.0E16 ions/cm$^3$. The impurity ions in the NMOS region include phosphorous (P) with its concentration in the range of about 1.0E15 ions/cm$^3$ to about 7.0E15 ions/cm$^3$. In another embodiment of the present invention, the semiconductor device further includes a gate structure 397 disposed over the bulb-type recess channel structure 340. The gate structure 397 includes a stacked structure having a gate electrode 393 and a gate hard mask layer pattern 395. In addition, the gate electrode 393 includes a stacked structure having a lower gate electrode 375 and an upper gate electrode 385.

Figure 4A:
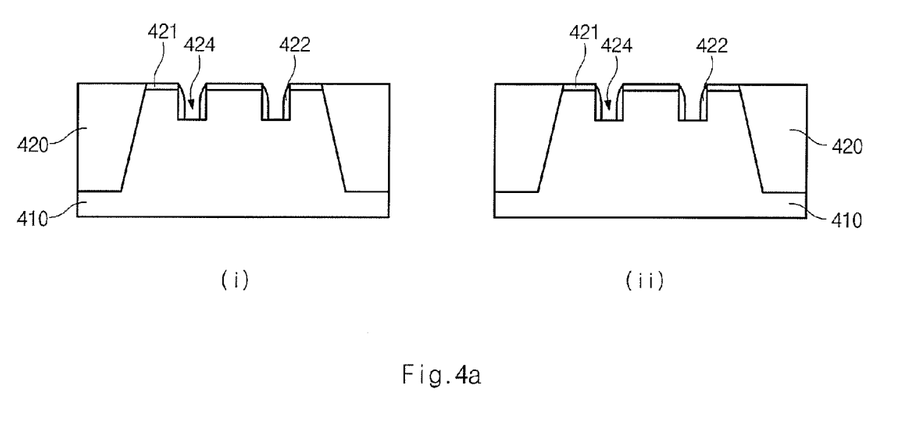
FIGS. 4a to 4g are simplified cross-sectional views illustrating a method for fabricating a semiconductor device according to an embodiment of the present invention.

FIGS. 4a to 4g illustrate simplified cross-sectional views of a method for fabricating a semiconductor device according to one embodiment of the present invention. FIGS. 4a(i) to 4g(i) illustrate simplified cross-sectional views in a NMOS region, and FIGS. 4a(ii) to 4g(ii) illustrate simplified cross-sectional views in a PMOS region. A hard mask layer 421 is formed over a semiconductor substrate 410 having a device isolation structure 420. The device isolation structure 420 defines an active region. A photoresist film (not shown) is formed over the hard mask layer 421. The photoresist film is exposed and developed using a recess gate mask (not shown) to form a photoresist film pattern (not shown). The hard mask layer 421 is etched by using the photoresist film pattern to form a recess region (not shown) exposing the semiconductor substrate 410 at the bottom of the recess region. The photoresist film pattern is removed. A given thickness of the semiconductor substrate 410 exposed at the bottom of the recess region is etched to form a first recess (or an upper recess) 424.

Figure 4B:
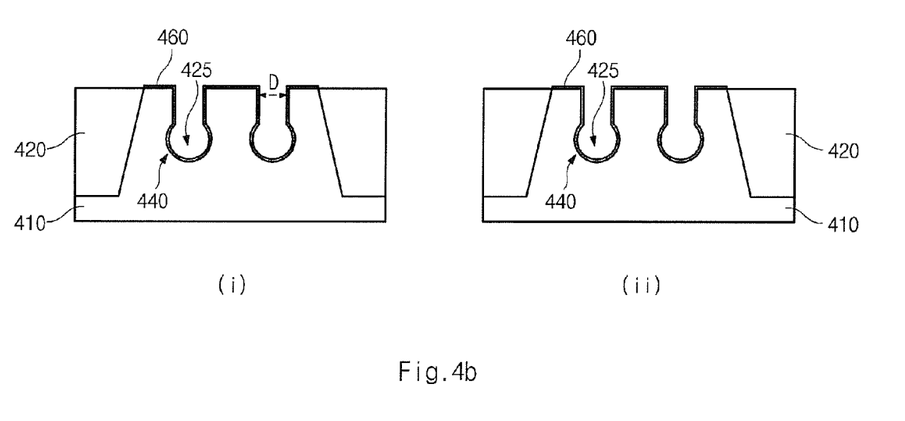

Referring to FIG. 4b, a sidewall spacer 422 is formed at a sidewall of the first recess 424. A given width of the semiconductor substrate 410 exposed at the bottom of the first recess 424 is etched by using the sidewall spacer 422 and the hard mask layer 421 as an etching mask to form a second recess (or a lower recess) 425. The sidewall spacer 422 and the hard mask layer 421 are removed to expose the semiconductor substrate 410. A gate insulating film 460 is formed over the exposed semiconductor substrate 410.

In one embodiment of the present invention, a recess channel structure 440 is formed in the first recess 424 and the second recess 425. In addition, the recess channel structure 440 has a lower recess channel structure and an upper recess channel structure. A latitudinal width of the lower recess channel structure is greater than that of the upper recess channel structure (D). In another embodiment of the present invention, the etching process for forming the second recess 425 is performed by an isotropic etching method.

Figure 4C:
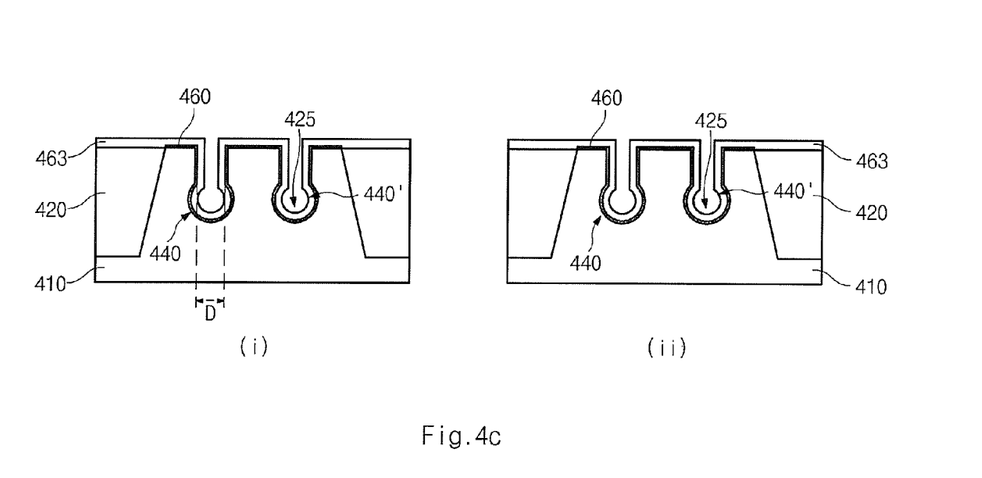
Figure 4D:
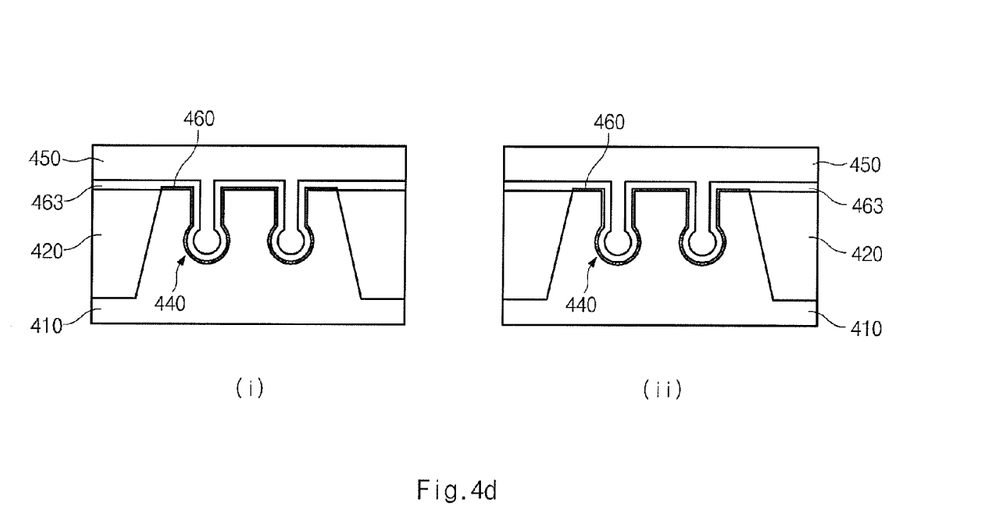

Referring to FIGS. 4c and 4d, a first lower gate conductive layer 463 is formed over a surface of the resultant (i.e. over the device isolation structure 420 and the semiconductor substrate 410 including the recess channel structure 440). The first lower gate conductive layer 463 is conformed conformal to the recess channel structure to define a recess 440'. A holding layer 450 is formed over the first lower gate conductive layer 463 to fill the recess channel structure 440 (i.e., to fill the recess 440').

In one embodiment of the present invention, a thickness of the first lower gate conductive layer 463 is less than a half of the latitudinal width of the upper recess channel structure, D/2. In addition, the first lower gate conductive layer 463 is formed of a polysilicon layer doped with impurity ions. The first lower gate conductive layer 463 is formed by forming a polysilicon layer and injecting the impurity ions into the polysilicon layer, thereby forming a doped polysilicon layer for the first lower gate conductive layer 463. Alternatively, the doped polysilicon layer may be formed by utilizing a silicon (Si) source gas and an impurity source gas during the deposition step. The impurity ion includes P with its concentration in the range of about 1.0E20 ions/cm$^3$ to about 4.0E20 ions/cm$^3$.

In one embodiment of the present invention, the holding layer 450 is selected from the group consisting of an insulating film, a metal film, a conductive layer, and combinations thereof. The holding layer 450 may be formed of a SOD oxide film. In addition, the holding layer 450 serves as a layer for preventing a seam from being generated in a filling process of the recess channel structure 440 and for minimizing a shift of the seam in a subsequent thermal treatment process.

Figure 4E:
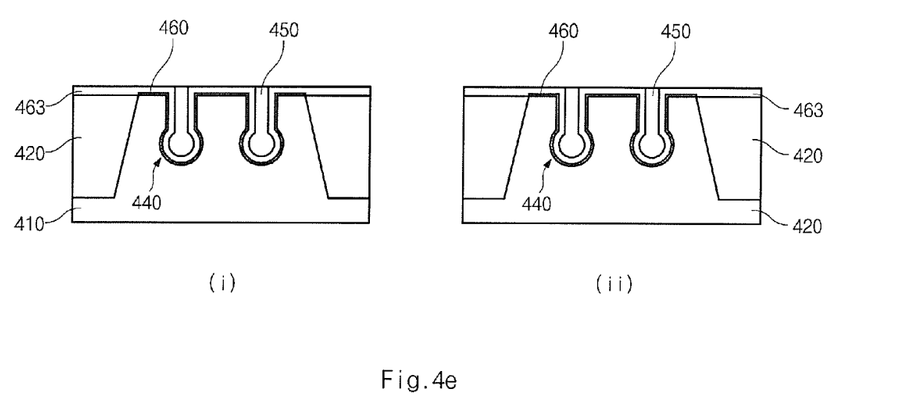
Figure 4F:
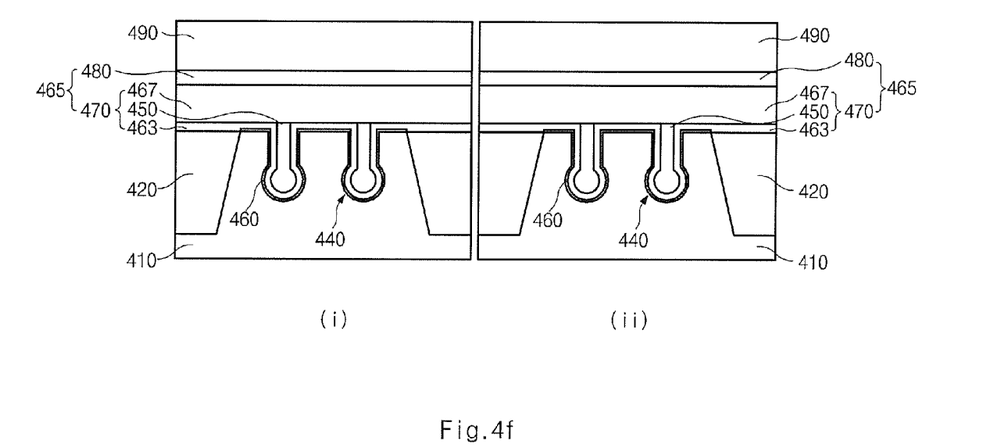
Figure 4G:
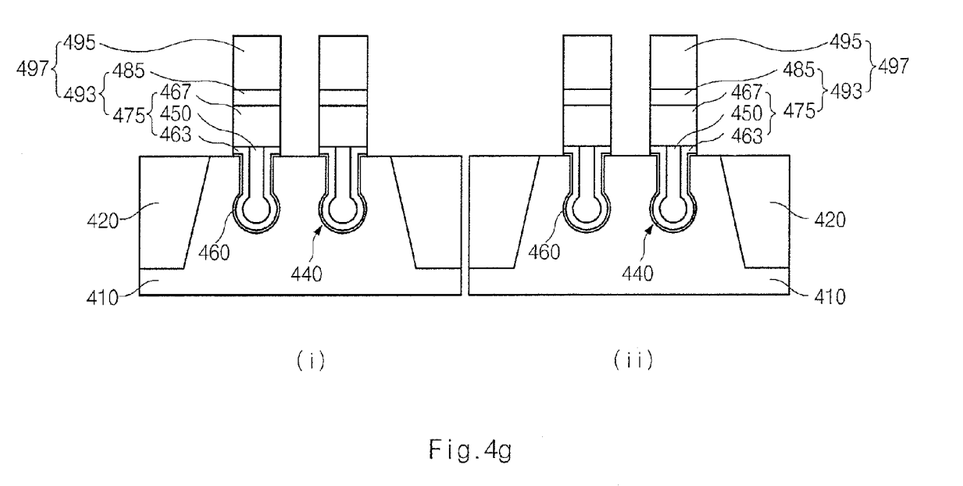

Referring to FIGS. 4e to 4g, the holding layer 450 is polished until the first lower gate conductive layer 463 is exposed. A second gate conductive layer 467 is formed over the first lower gate conductive layer 463 and the holding layer 450 to form a lower gate conductive layer 470.

In one embodiment of the present invention, the polishing process for the holding layer 450 is performed by a Chemical Mechanical Polishing ("CMP") method or an etch-back method. In addition, the second lower gate conductive layer 467 is formed of a polysilicon layer doped with impurity ions. The second lower gate conductive layer 467 is formed by forming a polysilicon layer and injecting impurity ions into the polysilicon layer, thereby forming a doped polysilicon layer for the second lower gate conductive layer 467. Alternatively, the doped polysilicon layer may be formed by utilizing a Si source gas and an impurity source gas during the deposition step. The polysilicon layer in the PMOS region includes B with its concentration in the range of about 5.0E15 ions/cm$^3$ to about 5.0E16 ions/cm$^3$. The polysilicon layer in the NMOS region includes P with its concentration in the range of about 1.0E15 ions/cm$^3$ to about 7.0E15 ions/cm$^3$.

An Rapid thermal annealing ("RTA") process is performed to drive the doped impurity ions into the polysilicon layer. An upper gate conductive layer 480 and a gate hard mask layer 490 are formed over the lower gate conductive layer 470. The gate hard mask layer 490, the upper gate conductive layer 480, and the lower gate conductive layer 470 are patterned by using a gate mask (not shown) to form a gate structure 497 including a stacked structure having a gate electrode 493 and a gate hard mask layer pattern 495.

In one embodiment of the present invention, the gate electrode 493 includes a stacked structure having a lower gate electrode 475 and an upper gate electrode 485. In addition, the upper gate conductive layer 480 is selected from the group consisting of a titanium nitride, a tungsten nitride film, a tungsten poly-side layer, a titanium poly-side layer, a titanium layer, a tungsten layer, and combinations thereof.

Figure 5A:
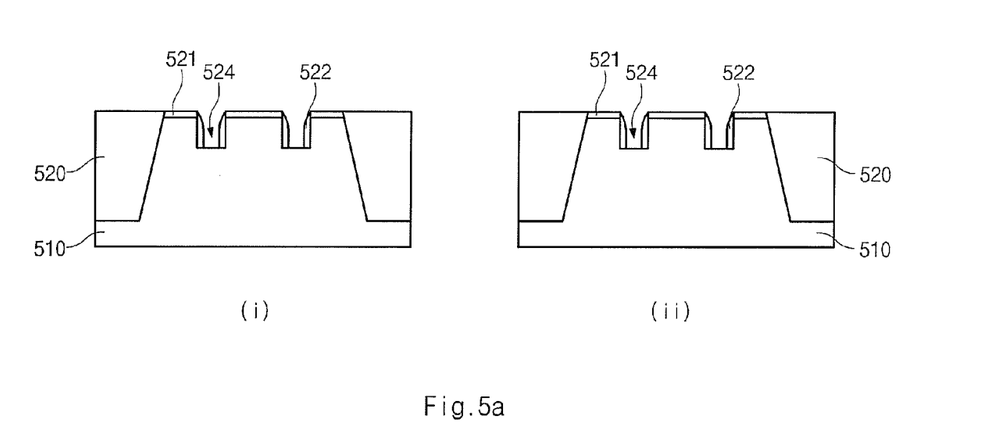
FIGS. 5a to 5f are simplified cross-sectional views illustrating a method for fabricating a semiconductor device according to another embodiment of the present invention.

FIGS. 5a to 5f illustrate simplified cross-sectional views of a method for fabricating a semiconductor device according to another embodiment of the present invention. FIGS. 5a(i) to 5f(i) illustrate simplified cross-sectional views in a NMOS region, and FIGS. 5a(ii) to 5f(ii) illustrate simplified cross-sectional views in a PMOS region. A hard mask layer 521 is formed over a semiconductor substrate 510 having a device isolation structure 520. The device isolation structure 520 defines an active region. A photoresist film (not shown) is formed over the hard mask layer 521. The photoresist film is exposed and developed using a recess gate mask (not shown) to form a photoresist film pattern (not shown). The hard mask layer 521 is etched by using the photoresist film pattern to form a recess region (not shown) exposing the semiconductor substrate 510 at the bottom of the recess region. The photoresist film pattern is removed. A given thickness of the semiconductor substrate 510 exposed at the bottom of the recess region is etched to form a first recess (an upper recess) 524.

Figure 5B:
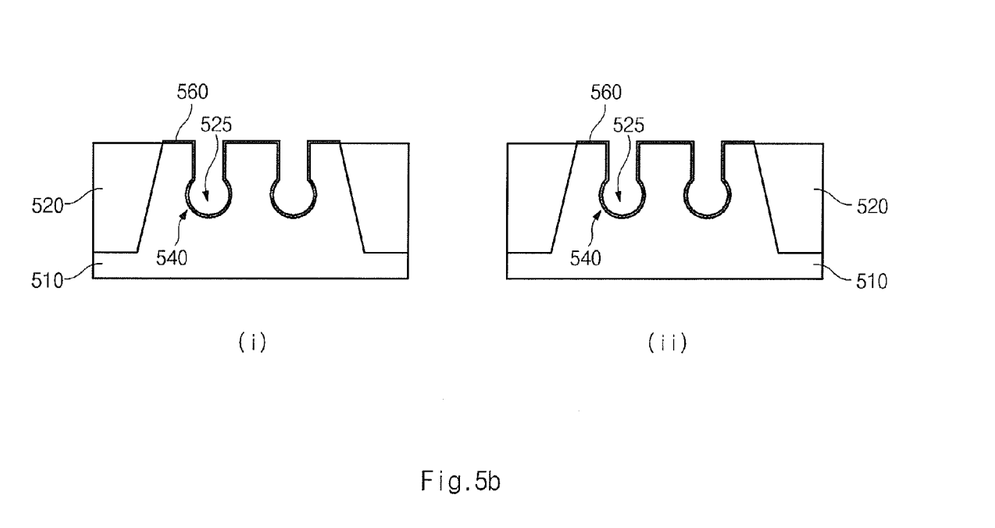

Referring to FIG. 5b, a sidewall spacer 522 is formed at a sidewall of the first recess 524. A given thickness of the semiconductor substrate 510 exposed at the bottom of the first recess 524 is etched by using the sidewall spacer 522 and the hard mask layer 521 as an etching mask to form a second recess (or a lower recess) 525. The sidewall spacer 522 and the hard mask layer 521 are removed to expose the semiconductor substrate 510. A gate insulating film 560 is formed over the exposed semiconductor substrate 510. A recess channel structure 540 is defined by the first recess 524 and the second recess 525. In addition, the recess channel structure 540 has a lower recess channel structure and an upper recess channel structure. A latitudinal width of the lower recess channel structure is greater than that of the upper recess channel structure. In another embodiment of the present invention, the etching process for forming the second recess 525 is performed by an isotropic etching method.

Figure 5C:
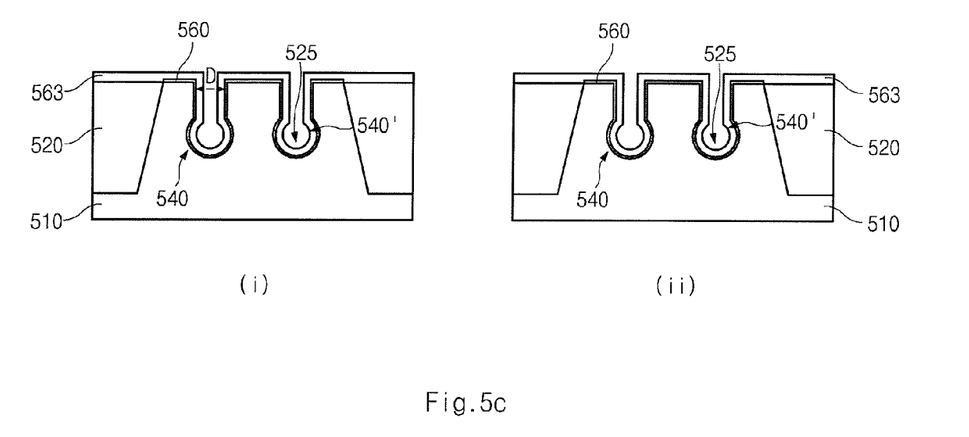
Figure 5D:
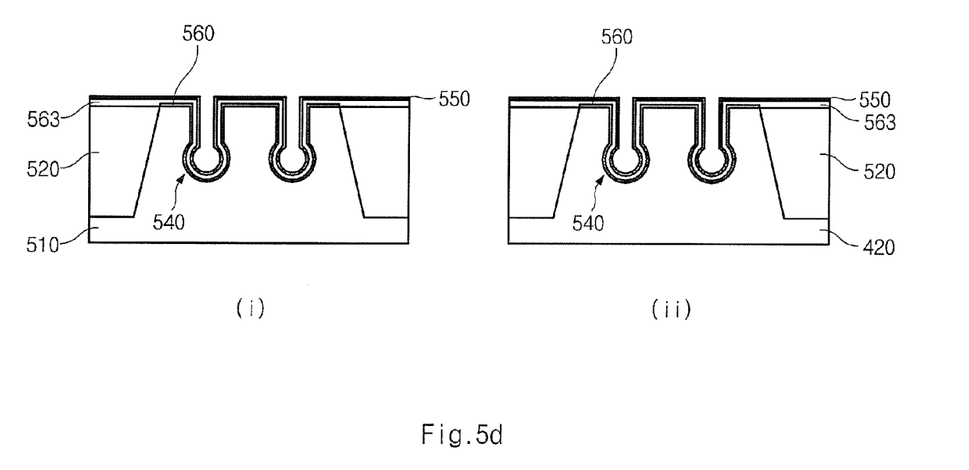

Referring to FIGS. 5c and 5d, a first lower gate conductive layer 563 is formed over a surface of the resultant (i.e. over the device isolation structure 520 and the semiconductor substrate 510 including the recess channel structure 540). The first lower gate conductive layer 563 is formed conformal to the recess structure 540 and defines a recess 540' therein. A surface of the first lower gate conductive layer 563 is subjected to a thermal treatment process to form a holding layer 550 over the first lower gate conductive layer 563.

In one embodiment of the present invention, the thermal treatment process for the formation of the holding layer 550 is performed under an atmosphere selected from the group consisting of nitrogen (N), phosphorous (P), an inert gas, and combinations thereof. The thermal treatment process is performed at a temperature of about 500° C. to about 1,000° C. for about 5 seconds to about 200 seconds. In particular, the thermal treatment process is performed at a temperature of about 550° C. to about 750° C. for about 10 seconds to about 30 seconds. In addition, the first lower gate conductive layer 563 is formed of an amorphous polysilicon layer doped with impurity ions. The first lower gate conductive layer 563 is formed by forming an amorphous polysilicon layer and injecting the impurity ions into the amorphous polysilicon layer, thereby forming a doped polysilicon layer for the first lower gate conductive layer 563. Alternatively, the doped polysilicon layer may be formed by utilizing a Si source gas and an impurity source gas during the deposition step. The impurity ion includes P with its concentration in the range of about 1.0E20 ions/cm$^3$ to about 4.0E20 ions/cm$^3$. In another embodiment of the present invention, the holding layer 550 is selected from the group consisting of an insulating film, a metal film, a conductive layer, and combinations thereof. The holding layer 550 may be formed of a crystallized polysilicon layer serving as a boundary layer for preventing a seam from being shifted in the second recess 525, wherein the seam may occur when the recess channel structure 540 is filled with a gate conductive layer in a subsequent process.

Figure 5E:
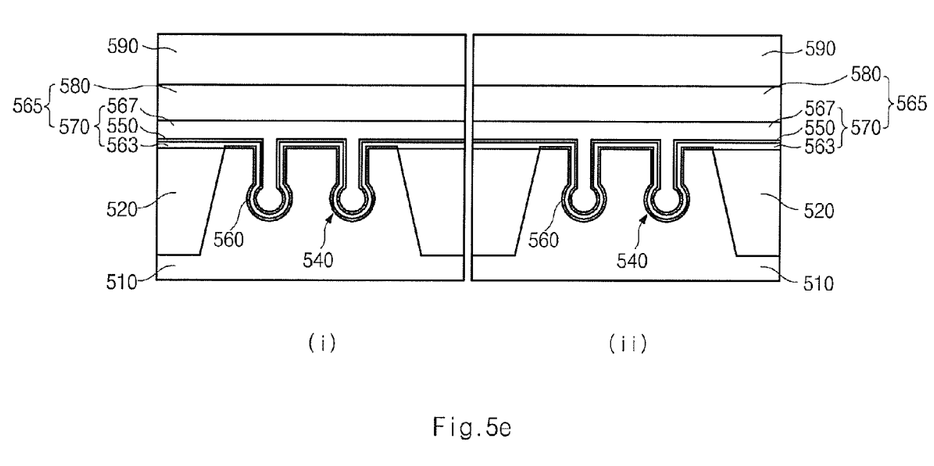
Figure 5F:
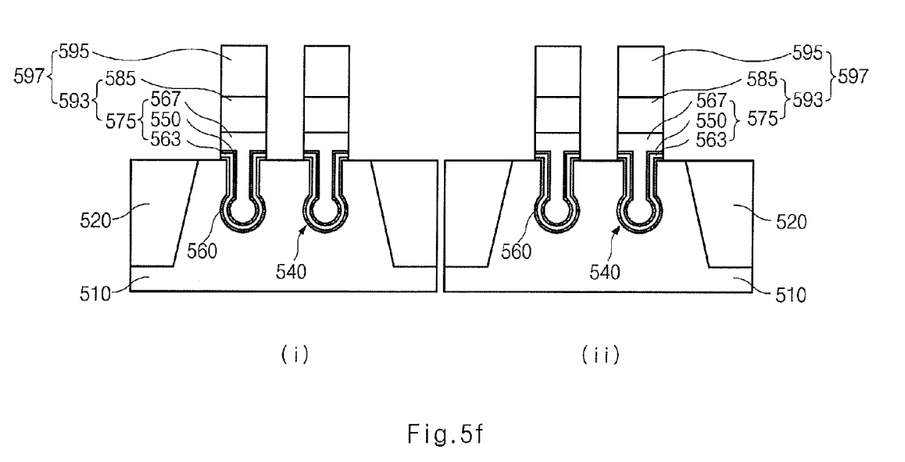

Referring to FIGS. 5e and 5f, a second gate conductive layer 567 is formed over the holding layer 550 to form a lower gate conductive layer 570 filling up the recess channel structure 540 (or recess 540'). An RTA process is performed to drive the doped impurity ions into the polysilicon layer. An upper gate conductive layer 580 and a gate hard mask layer 590 are formed over the lower gate conductive layer 570. The gate hard mask layer 590, the upper gate conductive layer 580, and the lower gate conductive layer 570 are patterned by using a gate mask (not shown) to form a gate structure 597 including a stacked structure having a gate electrode 593 and a gate hard mask layer pattern 595.

In one embodiment of the present invention, the second lower gate conductive layer 567 is formed of a polysilicon layer doped with impurity ions. The second lower gate conductive layer 567 is formed by forming a polysilicon layer and injecting the impurity ions into the polysilicon layer, thereby forming a doped polysilicon layer for the second lower gate conductive layer 567. Alternatively, the doped polysilicon layer may be formed by utilizing a Si source gas and an impurity source gas during the deposition step.

The polysilicon layer in the PMOS region includes B with its concentration in the range of about $5.0E15$ ions/cm$^3$ to about $5.0E16$ ions/cm$^3$. The polysilicon layer in the NMOS region includes P with its concentration in the range of about $1.0E15$ ions/cm$^3$ to about $7.0E15$ ions/cm$^3$. In another embodiment, the gate electrode 593 includes a stacked structure having a lower gate electrode 575 and an upper gate electrode 585. In addition, the upper gate conductive layer 580 is selected from the group consisting of a titanium nitride, a tungsten nitride film, a tungsten poly-side layer, a titanium poly-side layer, a titanium layer, a tungsten layer; and combinations thereof.

Figure 6:
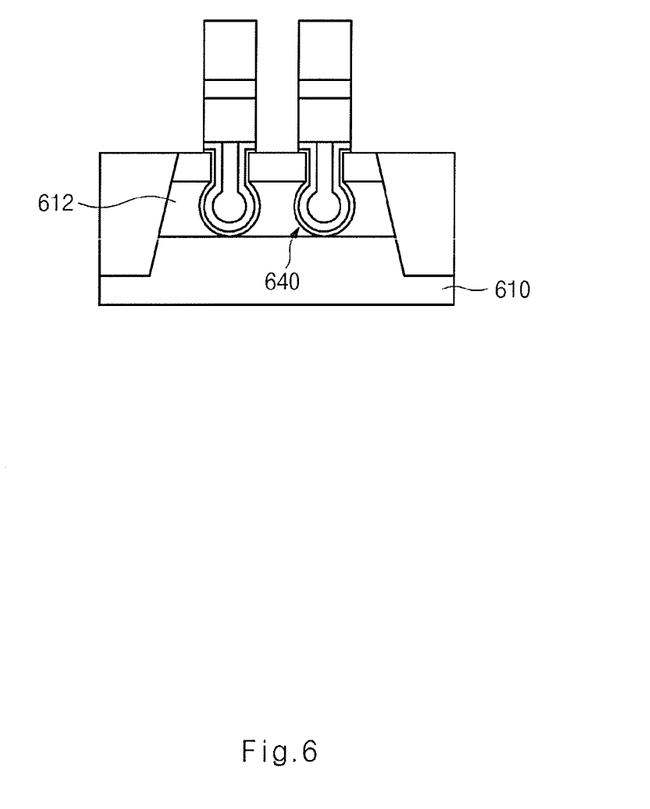
FIG. 6 is a simplified cross-sectional view illustrating a semiconductor device according to another embodiment of the present invention.

FIG. 6 is a simplified cross-sectional view illustrating a semiconductor device according to another embodiment of the present invention. A silicon germanium layer 612 is formed between a bulk semiconductor substrate 610 and an upper semiconductor substrate (not shown) to easily form a lower part of the three dimensional recess gate structure 640 in a subsequent process. In one implementation, the lower part of the three dimensional recess gate structure 640 may be formed via a wet etching method or a cleaning method using etch selectivity difference between the semiconductor substrate and the silicon germanium layer 612.

As described above, the semiconductor device in accordance with an embodiment of the present invention provides preventing the seam occurring in the filling process of the three-dimensional recess channel structure due to its topological characteristics and minimizing and the shift of the seam in the thermal treatment process. Accordingly, the operation characteristics of the transistor can be improved.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or in a non volatile memory device. Other additions, subtractions, or modifications are obvious in view of the present disclosure and are intended to fall within the scope of the appended claims.

What is claimed is:

1. A method for fabricating a semiconductor device, the method comprising:
    forming a recess channel structure in a semiconductor substrate having a device isolation structure defining an active region;
    forming a first lower gate conductive layer over the semiconductor substrate including the recess channel structure, the first lower gate conductive layer being conformal to the recess channel structure and defining a recess;
    forming a holding layer over the first lower gate conductive layer to fill the recess defined by the first lower gate conductive layer, the holding layer configured to hold a shift of a seam occurring in the recess channel structure;
    polishing the holding layer until the first lower gate conductive layer is exposed;
    forming a second lower gate conductive layer over the first lower gate conductive layer and the holding layer;
    forming an upper gate conductive layer over the second lower gate conductive layer; and
    patterning the upper gate conductive layer and the first and second lower gate conductive layers to form a gate structure.

2. The method according to claim 1, wherein the recess channel structure includes an upper recess channel structure and a lower recess channel structure, the lower recess channel structure having a latitudinal width greater than that of the upper recess channel structure.

3. The method according to claim 2, wherein the forming a recess channel structure includes:
    forming a first recess in the active region;
    forming a sidewall spacer on a sidewall of the first recess;
    etching the semiconductor substrate exposed at the bottom of the first recess by using the sidewall spacer as an etching mask to form a second recess; and
    removing the sidewall spacer.

4. The method according to claim 3, wherein the etching process for forming the second recess is performed by an isotropic etching method.

5. The method according to claim 1, wherein the first lower gate conductive layer includes a polysilicon layer doped with impurity ions.

6. The method according to claim 5, wherein the impurity ions include phosphorous (P) with a concentration in the range of about $1.0E20$ ions/cm$^3$ to about $4.0E20$ ions/cm$^3$.

7. The method according to claim 1, wherein a vertical thickness of the first lower gate conductive layer is less than the latitudinal width of the upper recess channel structure.

8. The method according to claim 1, wherein the second lower gate conductive layer includes a polysilicon layer doped with impurity ions.

9. The method according to claim 8, wherein the impurity ions include boron (B) or phosphorous (P) with a concentration in the range of about $1.0E15$ ions/cm$^3$ to about $7.0E15$ ions/cm$^3$.

10. The method according to claim 9, wherein the second lower gate conductive layer in a PMOS region is formed of the polysilicon layer doped with boron (B), wherein the second lower gate conductive layer in a NMOS region is formed of the polysilicon layer doped with phosphorous (P).

11. The method according to claim 1, wherein the holding layer is selected from the group consisting of an insulating film, a metal film, a conductive layer, and combinations thereof.

12. The method according to claim 11, wherein the holding layer is an oxide film.

13. The method according to claim 1, further comprising subjecting the second lower gate conductive layer to a Rapid thermal annealing ("RTA") process.

14. The method according to claim 1, further comprising forming a gate insulating film over the active region including the recess channel structure.

15. A method for fabricating a semiconductor device, the method comprising:
    forming a recess channel structure in a semiconductor substrate having a device isolation structure defining an active region;
    forming a first lower gate conductive layer over the semiconductor substrate including the recess channel structure, the first lower gate conductive layer being conformal to the recess channel structure and defining a recess;

performing a thermal treatment process on a surface of the first lower gate conductive layer to form a holding layer over the first lower gate conductive layer, the holding layer configured to hold a shift of a seam occurring in the recess channel structure; and forming a second lower gate conductive layer over the holding layer to fill up the recess channel structure;

forming an upper gate conductive layer over the second lower gate conductive layer; and patterning the upper gate conductive layer and the first and second lower gate conductive layers to form a gate structure.

16. The method according to claim 15, wherein the first lower gate conductive layer includes a polysilicon layer doped with impurity ions.

17. The method according to claim 16, wherein the impurity ions include phosphorous (P) with a concentration in the range of about 1.0E20 ions/cm$^3$ to about 4.0E20 ions/cm$^3$.

18. The method according to claim 15, wherein the holding layer is formed of a crystallized polysilicon layer.

19. The method according to claim 15, wherein the thermal process performed on the first lower gate conductive layer to form the holding layer is performed at a temperature in the range of about 550° C. to about 750° C. for about 10 seconds to about 30 seconds.

20. The method according to claim 15, wherein the thermal process is performed under a given atmosphere selected from the group consisting of nitrogen (N), phosphorous (P), an inert gas, and combinations thereof.

* * * * *